US008391818B2

(12) United States Patent  (10) Patent No.: US 8,391,818 B2
Morita et al.  (45) Date of Patent: Mar. 5, 2013

(54) SECOND-ORDER DISTORTION CORRECTING RECEIVER AND SECOND-ORDER DISTORTION CORRECTING METHOD

(75) Inventors: Tadashi Morita, Kanagawa (JP); Yoshito Shimizu, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/256,890

(22) PCT Filed: Apr. 2, 2010

(86) PCT No.: PCT/JP2010/002448
§ 371 (c)(1), (2), (4) Date: Sep. 27, 2011

(87) PCT Pub. No.: WO2010/113527
PCT Pub. Date: Oct. 7, 2010

(65) Prior Publication Data
US 2012/0002770 A1  Jan. 5, 2012

(30) Foreign Application Priority Data
Apr. 3, 2009  (JP) .................. 2009-091057

(51) Int. Cl.
*H04B 1/10* (2006.01)
*H04B 1/00* (2006.01)
(52) U.S. Cl. .................. 455/295; 455/63.1; 455/67.13; 455/296; 375/346
(58) Field of Classification Search .............. 455/63.1, 455/67.11, 67.13, 295, 296; 375/346, 348, 375/350
See application file for complete search history.

(56) References Cited

U.S. PATENT DOCUMENTS
(Continued)

FOREIGN PATENT DOCUMENTS
JP  6-7329  1/1994
JP  10-93461  4/1998
(Continued)

OTHER PUBLICATIONS
International Search Report dated May 25, 2010.
(Continued)

*Primary Examiner* — Quochien B Vuong
(74) *Attorney, Agent, or Firm* — Dickinson Wright PLLC

(57) ABSTRACT

A second-order distortion correcting receiver and a second-order distortion correcting method, wherein second-order inter-modulation distortion can be cancelled with high precision and with a simple circuit configuration, without requiring a complicated adjustment step. A non-linear active element unit (110) performs non-linear processing on an input signal to output a differential output signal and common mode output signal. A common mode detection unit (120) extracts the common mode output signal. A weighting unit (130) weights the extracted common mode output signal and thereby generates a corrected signal. A corrected signal injection unit (140) injects the corrected signal into a differential output signal to output a corrected differential output signal. A DC detection unit (150) calculates the average DC component of the corrected differential output signal. A weight determining unit (160) uses the average DC component to determine the weighting coefficient used by the weighting unit (130). At this time, the weight determining unit (160) sets, as the weighting coefficient, the coefficient that reduces the average DC component included in the corrected differential output signal to zero.

11 Claims, 11 Drawing Sheets

U.S. PATENT DOCUMENTS

| | | | | |
|---|---|---|---|---|
| 5,749,051 | A * | 5/1998 | Dent | 455/324 |
| 6,006,081 | A * | 12/1999 | Moore | 455/295 |
| 7,031,687 | B2 * | 4/2006 | Kivekas et al. | 455/313 |
| 7,043,208 | B2 * | 5/2006 | Nigra | 455/295 |
| 7,139,543 | B2 * | 11/2006 | Shah | 455/296 |
| 7,263,344 | B2 * | 8/2007 | Manku | 455/296 |
| 7,421,260 | B2 | 9/2008 | Darabi | |
| 2003/0174079 | A1 | 9/2003 | Soltanian | |
| 2006/0094361 | A1 | 5/2006 | Darabi | |

FOREIGN PATENT DOCUMENTS

| | | |
|---|---|---|
| JP | 2003-273945 | 9/2003 |

OTHER PUBLICATIONS

K. Dufrene, et al., "Digital Adaptive IIP2 Calibration Scheme for CMOS Downconversion Mixers," IEEE Journal of Solid-State Circuits, vol. 43, No. 11, pp. 2434-2445, p. 3, Line 1.

* cited by examiner

SECOND-ORDER DISTORTION CORRECTING RECEIVER AND SECOND-ORDER DISTORTION CORRECTING METHOD

TECHNICAL FIELD

The present invention relates to a radio communication apparatus. More particularly, the present invention relates to a second-order distortion correcting receiver and a second-order distortion correcting method for correcting second-order inter-modulation distortion.

BACKGROUND ART

In recent years, in a radio receiver such as a portable telephone and a One-Segment receiver, a wider bandwidth is being required. To achieve a receiving system of a wider bandwidth, a cancellation function of second-order inter-modulation distortion needs to be enhanced.

As a method that is very familiar in a cancellation system of second-order inter-modulation distortion, there is a method that is disclosed in non-patent literature 1. FIG. 1 is a block diagram showing a configuration of receiver 10 that is disclosed in non-patent literature 1. According to the method disclosed in non-patent literature 1, as shown in FIG. 1, a weighted reference signal is subtracted from an IF signal, thereby adjusting second-order inter-modulation distortion that is generated in mixer 11. A correction coefficient to be used for this weighting is determined by the following method.

Mixer 11 outputs a differential output signal to LPF (Low Pass Filter) 12, and outputs a common mode output signal to common mode detecting section 14. First, common mode detecting section 14 detects a common mode output signal from mixer 11, and LPF 15 performs a low pass filter process to this signal, and removes higher harmonic components of this signal. ADC (Analog to Digital Converter) 16 converts an output of LPF 15 to a digital signal, generates a reference signal of a digital region, and outputs the reference signal of the digital region to LMS 17.

Next, LPF 12 removes a higher harmonic signal from the differential output signal of mixer 11. ADC 13 converts an output of LPF 12 to a digital signal, generates an IF signal of the digital region, and outputs the IF signal of the digital region to LMS 17.

LMS (Least Mean Square) 17 obtains a correlation value between the reference signal of the digital region and the IF signal described above, and determines an optimal correction coefficient to be used to correct second-order inter-modulation distortion, by using an LMS algorithm.

As another cancellation system of second-order inter-modulation distortion, there is a method disclosed in Patent Literature 1. According to this system, as shown in FIG. 2, DC (direct current) detecting section 22 detects DC (direct current) components that are contained in the output of mixer 21. Receiver 20 injects a constant current corresponding to DC components from constant current source 23 into an output of mixer 21, thereby correcting the DC components of the mixer output and suppressing a second-order distortion.

CITATION LIST

Patent Literature

PTL 1
U.S. Pat. No. 7,421,260 Specification

Non-Patent Literature

NPL 1
IEEE JOURNAL OF SOLID-STATE CIRCUITS, VOL. 43, NO. 11, NOVEMBER 2008, "Digital Adaptive IIP2 Calibration Scheme for CMOS Down-conversion Mixers"

SUMMARY OF INVENTION

Technical Problem

However, according to the system of non-patent literature 1, to determine the correction coefficient, both the differential output signal and the common mode output signal of the mixer are necessary, and the correction coefficient cannot be determined by using only the differential output signal of the mixer. Further, to determine the correction coefficient by using the LMS algorithm by correlating between the differential output signal and the common mode output signal of the mixer, center voltages of both the differential output signal and the common mode output signal of the mixer need to be adjusted with high precision. Therefore, two circuits that adjust the center voltages of both the differential output signal and the common mode output signal of the mixer become necessary, and an additional process for this adjustment becomes necessary.

Further, according to the system of Patent Literature 1, there is a problem in that it is difficult to sufficiently cancel second-order inter-modulation distortion.

It is therefore an object of the present invention to provide a second-order distortion correcting receiver and a second-order distortion correcting method that can cancel second-order inter-modulation distortion with high precision in a simple circuit configuration without requiring a complex adjusting process.

Solution to Problem

A second-order distortion correcting receiver according to the present invention includes: an active element having a nonlinear characteristic that performs a nonlinear process of an input signal and outputs a differential output signal and a common mode output signal; a common mode detecting section that extracts the common mode output signal; a weighting section that generates a corrected signal, by weighting the common mode output signal that is extracted; a corrected-signal injecting section that injects the corrected signal into the differential output signal, and outputs a corrected differential-output signal; a DC component detecting section that calculates an average DC component of the corrected differential-output signal; and a weight determining section that determines a weighting coefficient to be used in the weighting section, by using the average DC component.

A second-order distortion correcting method according to the present invention is a second-order distortion correcting method for removing second-order distortion components that are generated by an active element having a nonlinear characteristic, the method including: extracting a differential output signal and a common mode output signal that are obtained by a nonlinear process performed by the active element to an input signal; generating a corrected signal, by weighting the common mode output signal; outputting a corrected differential-output signal, by injecting the corrected signal to the differential output signal; calculating an average DC component of the corrected differential-output signal; and determining a weighting coefficient to be used for the weighting, by using the average DC component.

According to these, a weighting coefficient to be used for the common mode output signal can be determined, by using the average DC component of the corrected differential-output signal that is obtained by injecting the corrected signal into the differential output signal. Therefore, second-order inter-modulation distortion can be cancelled with high precision, in a simple circuit configuration.

Advantageous Effects of Invention

According to the present invention, a weighting coefficient to cancel second-order distortion components can be determined, by using only a differential output signal of a nonlinear active element. Further, second-order inter-modulation distortion can be cancelled with high precision, in a simple circuit configuration, without requiring a complex adjusting process.

DESCRIPTION OF EMBODIMENTS

Embodiments of the present invention are explained in detail below with reference to drawings.

(A Basic Configuration of a Second-Order Distortion Correcting Receiver)

Figure 1:
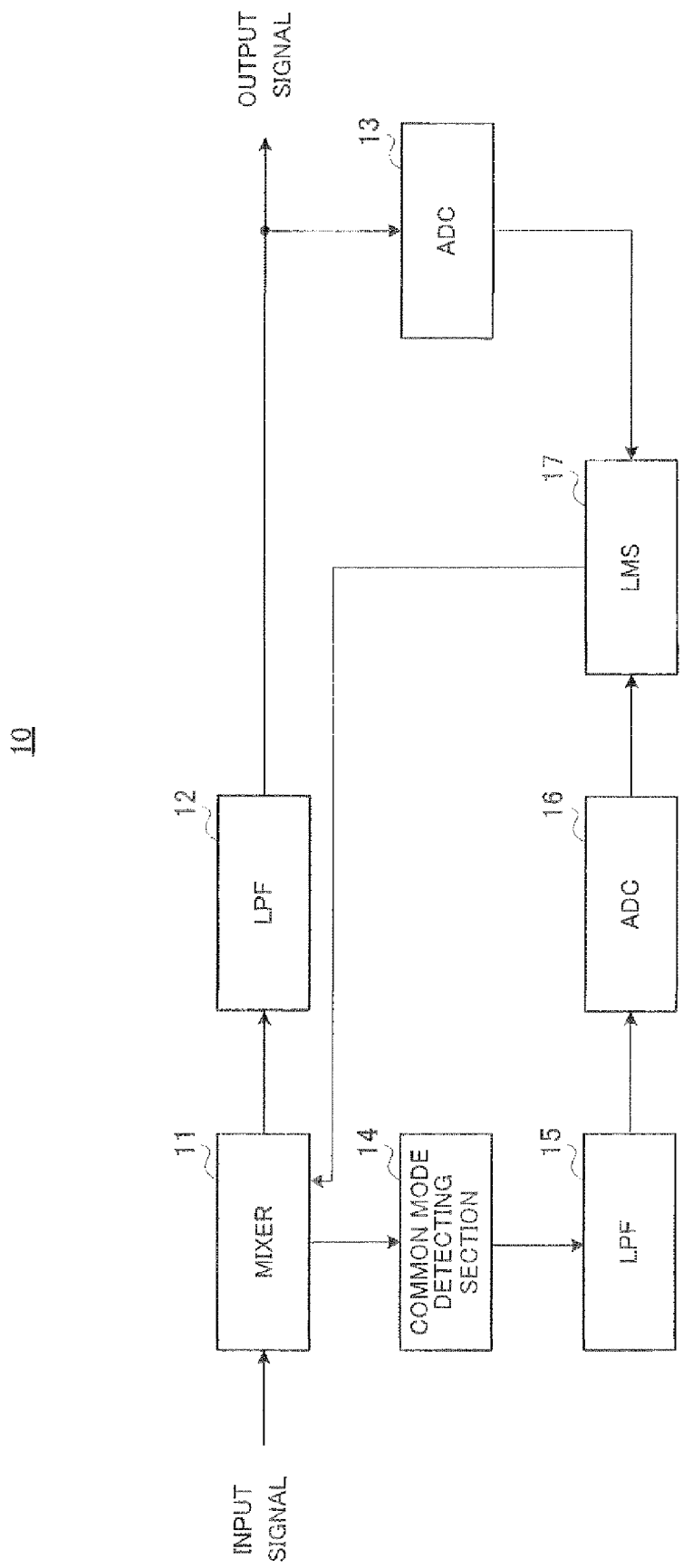
FIG. 1 shows a configuration of a receiver according to non-patent literature 1.
Figure 2:
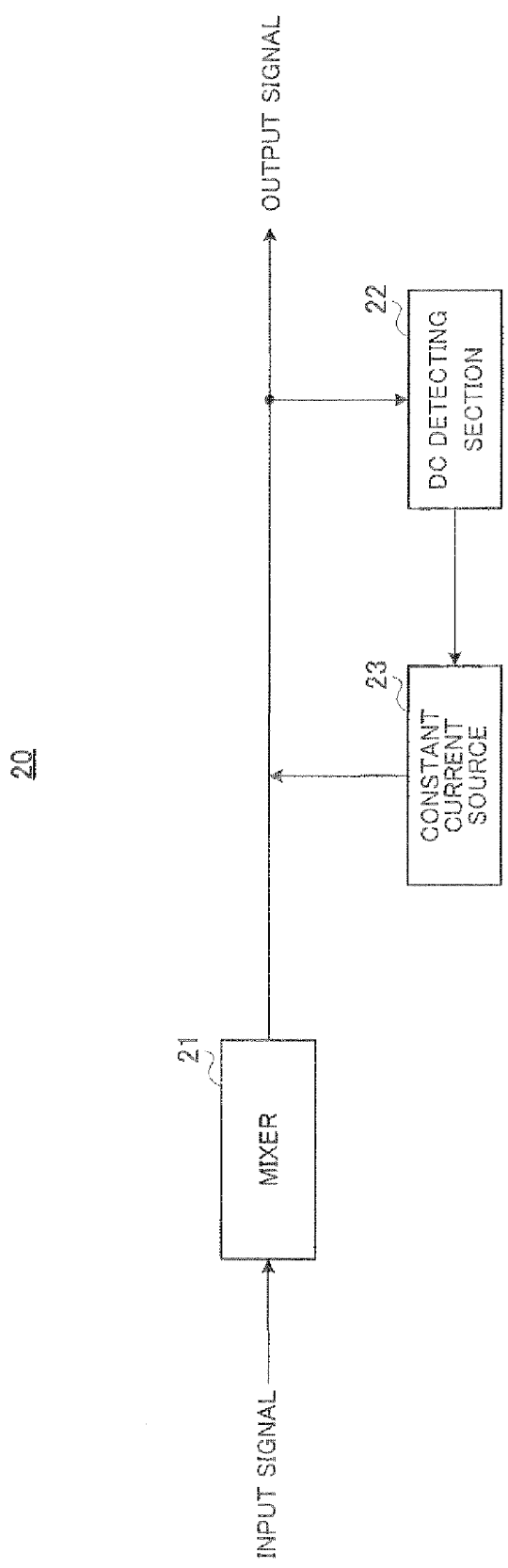
FIG. 2 shows a configuration of a receiver according to Patent Literature 1.
Figure 3:
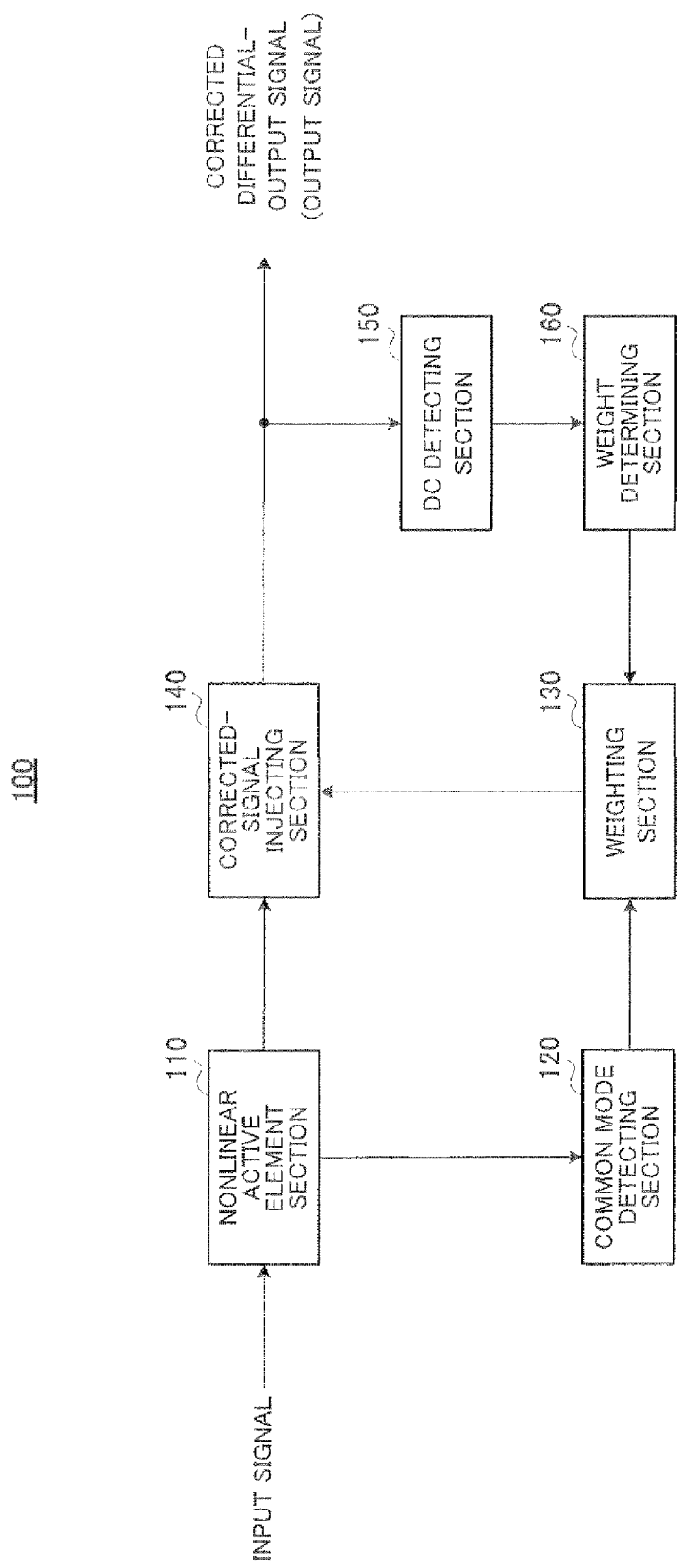
FIG. 3 is a block diagram showing a basic configuration of a receiver according to the present invention.

FIG. 3 is a block diagram showing a basic configuration of receiver 100 according to the present invention.

Nonlinear active element section 110 nonlinearly converts an input signal, and outputs a differential output signal and a common mode output signal that are obtained by this nonlinear conversion. In this case, the differential output signal indicates a component of a difference of two types of output signals in a differential system, when a differential-output type active element (the differential system) is used for nonlinear active element section 110. The common mode output signal indicates a component of a sum of the two types of output signals in the differential system.

This nonlinear active element section 110 has a nonlinear characteristic, and is configured by a mixer, for example. Second-order inter-modulation distortion components are mixed in the differential output signal.

Common mode detecting section 120 detects a common mode output signal that is output from nonlinear active element section 110. The detected common mode output signal contains both DC (direct current) components that are generated by a signal input and AC components that contain second-order inter-modulation distortion components.

Second-order distortion components have a tendency of being cancelled by a differential output, and have a characteristic that the second-order distortion components are output by being enhanced with each other in the common mode output.

Weighting section 130 weights the common mode output signal by using a weighting coefficient to be determined by weight determining section 160 described later, and generates a corrected signal.

Corrected-signal injecting section 140 subtracts the corrected signal output from weighting section 130, from the differential output signal of nonlinear active element section 110, and generates a corrected differential-output signal. As a result, the second-order distortion components that are contained in the differential output signal are removed. A method for removing distortion components is described later.

Next, DC detecting section 150 detects an average DC component of the corrected differential-output signal that is output from corrected-signal injecting section 140. A method for detecting the average DC component by DC detecting section 150 is described later.

Weight determining section 160 calculates a more optimal weighting coefficient, from the average DC component that is detected by DC detecting section 150, and from a weighting coefficient at the current time, and outputs the calculated weighting coefficient to weighting section 130. A method for calculating the weighting coefficient is described later.

(A Relationship Between Second-Order Inter-Modulation Distortion Components and DC Components)

A relationship between second-order inter-modulation distortion that occurs when a certain signal is input to a nonlinear active element and DC offset is explained below. Second-order inter-modulation distortion is reported to occur by a square component of nonlinear active elements. An input/output model concerning a square calculation of equation 1 is considered next. In equation 1, X is an input signal, and Y is an output signal.

[1]

$$Y = X^2 \qquad \text{Equation 1}$$

Consider a case where two tone waves that have mutually the same amplitude A and have different frequencies are input as an input signal X, as represented by equation 2.

[2]

$$X = A \cos \omega 1 \cdot t + A \cos \omega 2 \cdot t \qquad \text{Equation 2}$$

An output signal Y in this case is represented by equation 3.

Equation 3

$$Y = A^2 \cdot \frac{1}{2} \cdot \{1 + \cos 2\omega 1 \cdot t + 2\cos(\omega 1 + \omega 2) \cdot t + 2\cos(\omega 1 - \omega 2) \cdot t + 1 + \cos 2\omega 2 \cdot t\} \qquad [3]$$

In this case, because a receiver that uses a differential-output type active element is assumed for the nonlinear active element, K1 and K2 (K1−K2≪1) are introduced as coefficients that represent unbalanced components between differential outputs. When respective signals of differential components are obtained by multiplying K1 or K2 to equation 3, differential output components (Y1, Y2) can be represented by equations 4 and 5 respectively.

Equation 4

$$Y1 = K1 \cdot A^2 \cdot \frac{1}{2} \cdot \{1 + \cos 2\omega 1 \cdot t + 2\cos(\omega 1 + \omega 2) \cdot t + 2\cos|\omega 1 - \omega 2| \cdot t + 1 + \cos 2\omega 2 \cdot t\} \quad [4]$$

Equation 5

$$Y2 = K2 \cdot A^2 \cdot \frac{1}{2} \cdot \{1 + \cos 2\omega 1 \cdot t + 2\cos(\omega 1 + \omega 2) \cdot t + 2\cos|\omega 1 - \omega 2| \cdot t + 1 + \cos 2\omega 2 \cdot t\} \quad [5]$$

From equations 4 and 5, second-order inter-modulation distortion components and DC components are extracted respectively, and they are arranged as their differential components. A differential component IM2_diff of the second-order inter-modulation distortion components is represented by equation 6, and a differential component DC_diff of DC components is represented by equation 7.

Equation 6

$$IM2\_diff = (K1 - K2) \cdot A^2 \cdot \frac{1}{2} \cdot \cos|\omega 1 - \omega 2| \cdot t \quad [6]$$

Equation 7

$$DC\_diff = (K1 - K2) \cdot A^2 \cdot \frac{1}{2} \quad [7]$$

Similarly, from equations 4 and 5, second-order inter-modulation distortion components and DC components are extracted respectively, and they are arranged as their common mode components. A common mode component IM2_com of the second-order inter-modulation distortion components is represented by equation 8, and a common mode component DC_com of DC components is represented by equation 9.

Equation 8

$$IM2\_com = (K1 + K2) \cdot A^2 \cdot \frac{1}{2} \cdot \cos|\omega 1 - \omega 2| \cdot t \quad [8]$$

Equation 9

$$DC\_com = (K1 + K2) \cdot A^2 \cdot \frac{1}{2} \quad [9]$$

A weighting coefficient w is multiplied to the above common mode component, a corrected signal obtained is injected into the differential output signal of the nonlinear active element, and a corrected differential-output signal component obtained is arranged. Second-order inter-modulation distortion components IM2_out that are contained in the corrected differential-output signal are represented by equation 10, and DC components DC_out that are contained in the corrected differential-output signal are represented by equation 11.

Equation 10

$$IM2\_out = \{(K1 - K2) + w(K1 + K2)\} \cdot A^2 \cdot \frac{1}{2} \cdot \cos|\omega 1 - \omega 2| \cdot t \quad [10]$$

Equation 11

$$DC\_out = \{(K1 - K2) + w(K1 + K2)\} \cdot A^2 \cdot \frac{1}{2} \quad [11]$$

By paying attention to the DC components DC_out in equation 11, finding the weighting coefficient w that makes the components completely zero is considered. It is expected that w that makes the DC components DC_out completely zero becomes w_cal that is represented in equation 12.

[12]

$$w\_cal = -(K1-K2)/(K1+K2) \quad \text{Equation 12}$$

The second-order inter-modulation distortion components IM2_out that are contained in the above corrected differential-output signal are checked, in a state of this w=w_cal. It becomes clear that IM2_out becomes zero, when w_cal of equation 12 is substituted into w of equation 10.

That is, it becomes clear that the second-order inter-modulation distortion components that are contained in a final output (the corrected differential-output signal) also become zero, when receiver 100 generates the corrected signal by weighting common mode output signals by using the weighting coefficient (w=w_cal) which makes DC components contained in the final output (the corrected differential-output signal) zero, injects this corrected signal into the differential output signal and outputs the final output (the corrected differential-output signal).

Inventors of the present invention have found the above-described relationship between second-order inter-modulation distortion components and DC components, and have invented the second-order correcting receiver and the second-order correcting method according to the present invention.

(Embodiment 1)

In the present embodiment, a receiver and a distortion correcting method that can cancel with high precision the second-order inter-modulation distortion are explained. A configuration of the receiver according to the present embodiment is similar to the configuration shown in FIG. 3, and therefore, is explained with reference to FIG. 3.

Nonlinear active element section 110 nonlinearly converts an input signal, and outputs a differential output signal and a common mode output signal that are obtained by this nonlinear conversion. This nonlinear active element section 110 has a nonlinear characteristic, and is configured by a mixer, for example. Second-order inter-modulation distortion components are mixed in the differential output signal. DC components and the second-order inter-modulation distortion components that are contained in the differential output signal are expressed by above equations 6 and 7.

Common mode detecting section 120 detects a common mode output signal that is output from nonlinear active element section 110. The detected common mode output signal contains both DC components that are generated by a signal input and AC components that contain second-order inter-modulation distortion components. These components are represented respectively by above equations 8 and 9.

Weighting section 130 weights the common mode output signal by using a weighting coefficient, and generates a corrected signal. The weighting can be achieved specifically by using a current mirror circuit or by using a variable amplifier.

Corrected-signal injecting section 140 injects the corrected signal generated by weighting the common mode output signal, into the differential output signal of nonlinear active element section 110, and generates a corrected differential-output signal. DC components and second-order inter-modulation distortion components that are contained in the corrected differential-output signal are represented respectively by above equations 10 and 11.

Figure 4:
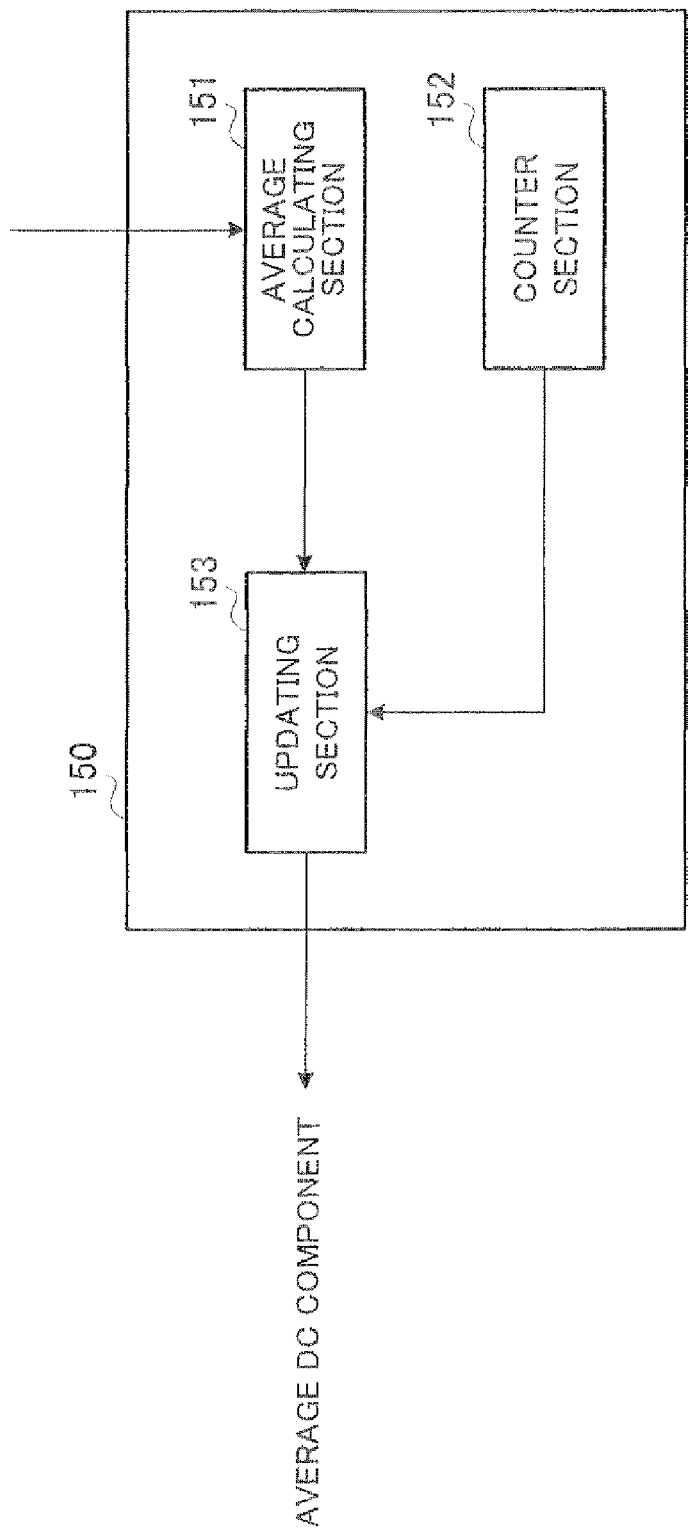
FIG. 4 is a block diagram showing an internal configuration of a DC detecting section according to Embodiment 1 of the present invention.

DC detecting section 150 detects an average DC component of the corrected differential-output signal. FIG. 4 is a block diagram showing a detailed configuration of DC detecting section 150.

Average calculating section 151 performs an average calculation with the corrected differential-output signal that has been input by then. As a specific configuration example of this average calculating section 151, a first-order IIR (Infinite Impulse Response) filter can be used.

Counter section 152 counts a regular period that is determined in advance, and outputs an update timing signal to updating section 153 during each regular period.

When an update timing signal given from counter section 152 during each regular period is input, updating section 153 updates an average value calculated by average calculating section 151, and outputs the updated value as an average DC component.

The regular period that is determined in advance is 20 milliseconds, for example. However, this "regular period" needs to be a long time that extends over several symbols, to detect DC components without depending on communicated data, and this length is different according to a communication system.

Referring back to FIG. 3 again, weight determining section 160 determines a weighting coefficient by using an average DC component that is contained in the corrected differential-output signal. Specifically, weight determining section 160 uses a coefficient w_cal that sets the average DC component contained in the corrected differential-output signal, as the weighting coefficient. The coefficient w_cal is obtained from equation 12 described above.

Weight determining section 160 calculates a more optimal weighting coefficient (w(t+1)) at the next time, from the average DC component that is detected by DC detecting section 150, and from a weighting coefficient(w(t)) at the current time. The weighting coefficient (w(t+1)) at the next time can be obtained from the following equation 13.

[13]

$$w(t+1) = \text{average } DC \times \mu + w(t) \quad \text{(Equation 13)}$$

In equation 13, $\mu$ is an update coefficient, and this is a sufficiently small fixed value in the present embodiment. When a large value is selected for this update coefficient $\mu$, time required for the weighting coefficient w(t) to converge to an optimal value becomes short, but stability of a system having receiver 100 tends to become low. On the other hand, when a small value is selected for this update coefficient $\mu$, time required for the weighting coefficient w(t) to converge to an optimal value becomes long, but stability of the system tends to be improved. Therefore, the optimal update coefficient $\mu$ in this system is assumed to be determined by selecting an optimal value by actually performing an evaluation.

Updating of the weighting coefficient w(t) by the above equation 13 can be easily achieved by using a multiplying circuit and an adding circuit for updating section 153 shown in FIG. 4. Multiplication can be also achieved by a bit shift instead of the multiplying circuit.

In this way, the weighting coefficient w(t) that is calculated by weight determining section 160 is output to weighting section 130. Weighting section 130 assigns weight to the common mode output signal by using the weighting coefficient w(t).

The above-described system is based on the assumption that the system is adjusted in advance such that DC offset components of an output signal of corrected-signal injecting section 140 become completely zero when no signal is input to nonlinear active element section 110.

DC detecting section 150 detects DC components of the corrected differential-output signal that is output from corrected-signal injecting section 140, in a state that a certain input signal is input to nonlinear active element section 110, in a state that DC offset components of the output signal of corrected-signal injecting section 140 are adjusted in advance such that they become completely zero. Weight determining section 160 determines the weighting coefficient such that the DC components become zero. Weighting section 130 generates a corrected signal by assigning weight to the common mode output signal by using the weighting coefficient. Corrected-signal injecting section 140 removes second-order inter-modulation distortion components from the corrected differential-output signal, by injecting the corrected signal into the differential output signal.

In this way, in the present embodiment, the above-described relationship between second-order inter-modulation distortion components and DC components is used. That is, in the present embodiment, there is used a relationship that the weighting coefficient (see equation 12) that can completely cancel DC components of the corrected differential-output signal and the weighting coefficient that can completely cancel second-order inter-modulation distortion components of the corrected differential-output signal have the same value. Therefore, when determining the weighting coefficient, it is sufficient to use only DC components of the corrected differential-output signal that are detected by DC detecting section 150, and adjustment of center voltages of the corrected differential-output signal and the common mode output signal is not necessary. Accordingly, second-order inter-modulation distortion components can be cancelled with high precision in a simple circuit configuration, without requiring a complex adjusting process.

As described above, nonlinear active element section 110 performs a nonlinear process to the input signal, and outputs the differential output signal and the common mode output signal. Common mode detecting section 120 extracts the common mode output signal. Weighting section 130 generates the corrected signal, by assigning weight to the extracted common mode output signal. Corrected-signal injecting section 140 injects the corrected signal into the differential output signal, and outputs the corrected differential-output signal. DC detecting section 150 calculates an average DC component of the corrected differential-output signal. Weight determining section 160 determines the weighting coefficient to be used in weighting section 130, by using the average DC component. In this case, weight determining section 160 uses a coefficient that makes the average DC component contained in the corrected differential-output signal zero, as the weighting coefficient.

As described above, weighting section 130 can generate the corrected signal by assigning weight to common mode output signals, by using the weighting coefficient (see equation 12) that can cancel DC components. Corrected-signal injecting section 140 can cancel second-order inter-modulation distortion components, by outputting the corrected differential-output signal by injecting the corrected signal into the differential output signal.

According to the present embodiment, because the weighting coefficient is determined by using only the corrected differential-output signal, a circuit to adjust the center voltages of the differential output signal and the common mode output signal becomes unnecessary, and an adjusting process for this also becomes unnecessary. As a result, the second-order inter-modulation distortion can be cancelled with high precision in a simple structure, without requiring a complex adjusting process.

(Embodiment 2)

Figure 5:
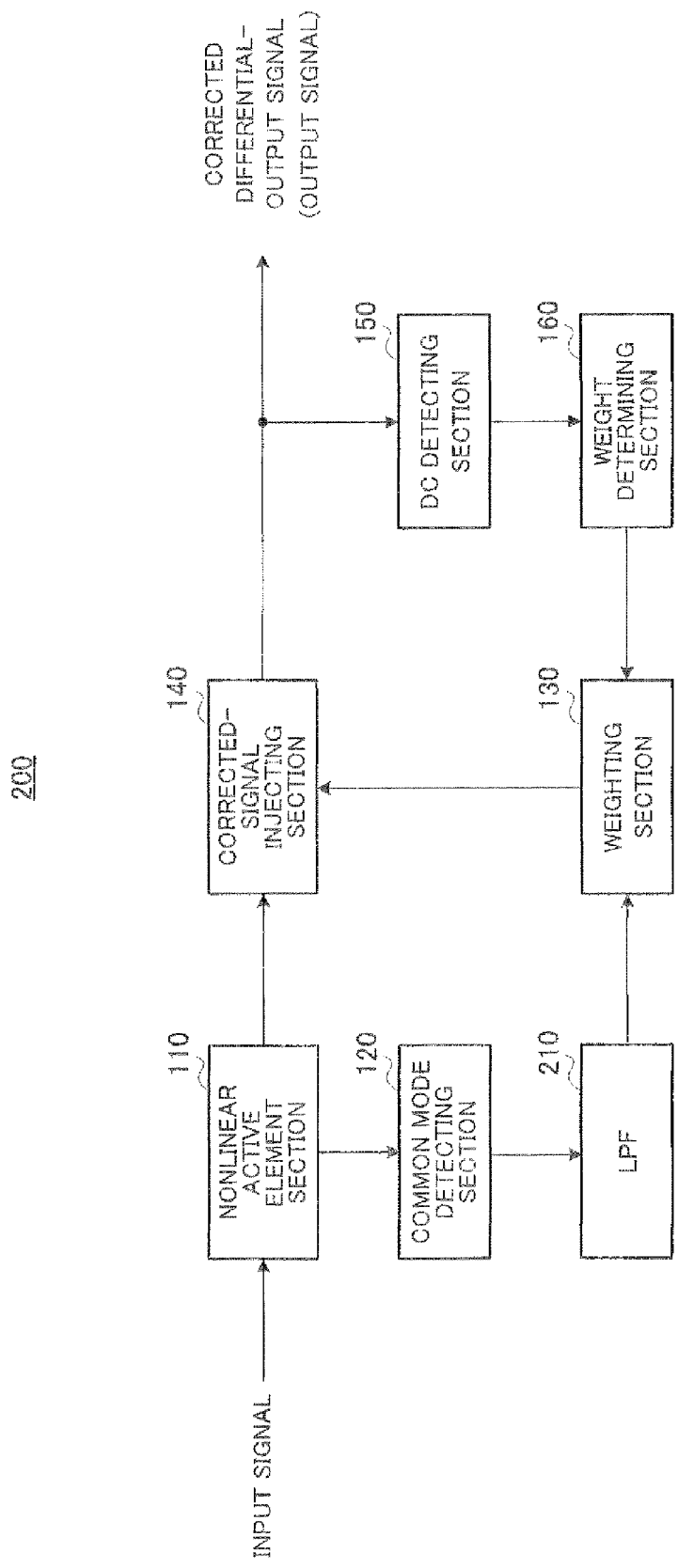
FIG. 5 is a block diagram showing a relevant configuration of a receiver according to Embodiment 2 of the present invention.

FIG. 5 is a block diagram showing a relevant configuration of a receiver according to the present embodiment. In receiver 200 in FIG. 5, constituent portions that are common to those of receiver 100 in FIG. 3 are assigned with the same reference numerals as those in FIG. 3, and their explanation is omitted. Receiver 200 in FIG. 5 is configured to have LPF 210 added to between common mode detecting section 120 and weighting section 130 of receiver 100 in FIG. 3, For LPF 210, a filter is used that removes unnecessary interference waves outside the band, by setting second-order inter-modulation distortion components to be cancelled as a pass frequency band. By providing LPF 210 at a latter stage of common mode detecting section 120, LPF 210 removes components other than the second-order inter-modulation distortion components out of the common mode output signal. Therefore, only frequency components that are the same as the second-order inter-modulation distortion components are input out of the common mode output signal. As a result, because weighting section 130 can generate a proper corrected signal, corrected-signal injecting section 140 can cancel the second-order inter-modulation distortion components with high precision.

As described above, according to the present embodiment, receiver 200 includes LPF 210 that removes frequency components other than the frequency band of the common mode output signal, between common mode detecting section 120 and weighting section 130. With this arrangement, the second-order inter-modulation distortion can be cancelled with high precision in a simple circuit configuration.

(Embodiment 3)

Figure 6:
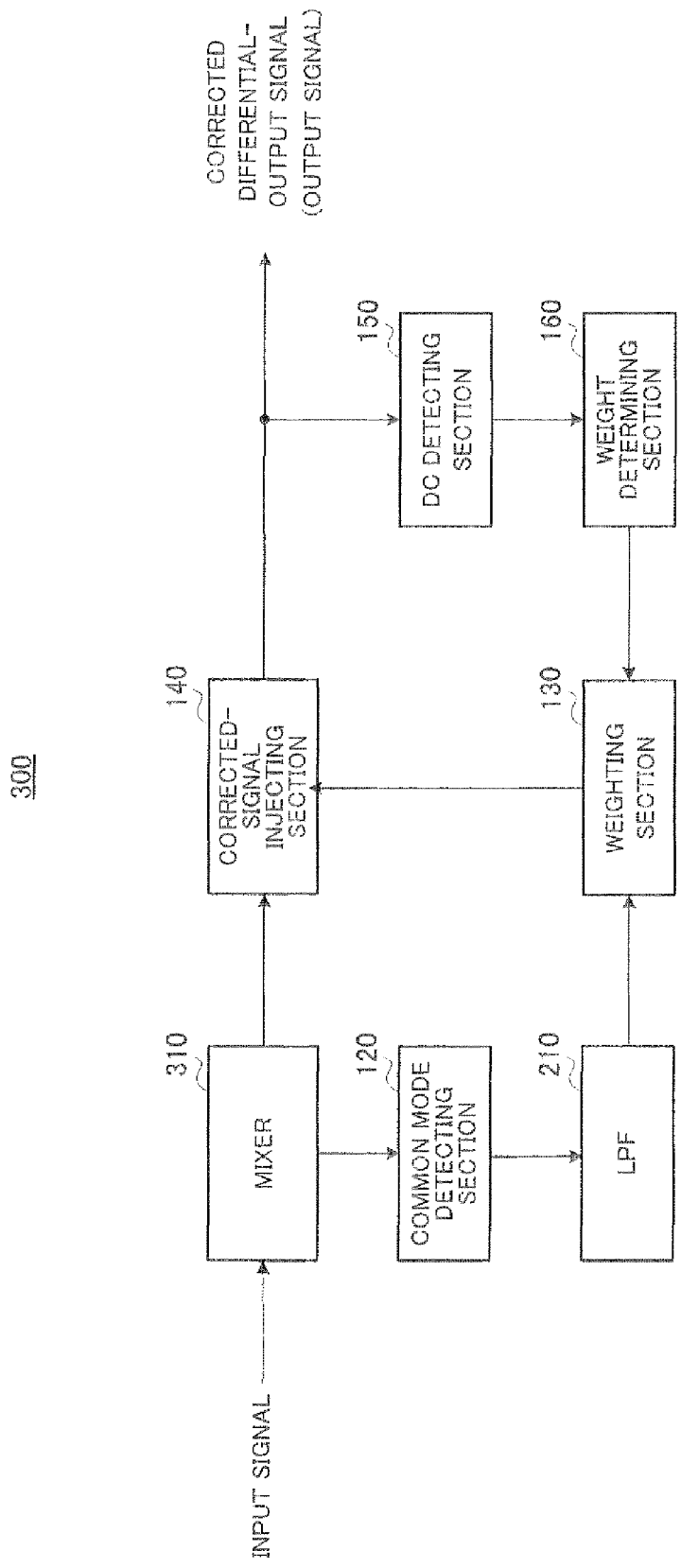
FIG. 6 is a block diagram showing a relevant configuration of a receiver according to Embodiment 3 of the present invention.

FIG. 6 is a block diagram showing a relevant configuration of a receiver according to the present embodiment. In receiver 300 in FIG. 6, constituent portions that are common to those of receiver 200 in FIG. 5 are assigned with the same reference numerals as those in FIG. 5, and their explanation is omitted. In the present embodiment, mixer 310 is applied to nonlinear active element section 110, as an example.

Mixer 310 down-converts a frequency of an input signal to a lower frequency band. Mixer 310 outputs the differential output signal and the common mode output signal that are obtained when down-converting the frequency of the input signal to a lower frequency band, to corrected-signal injecting section 140 and common mode detecting section 120 respectively.

Figure 7:
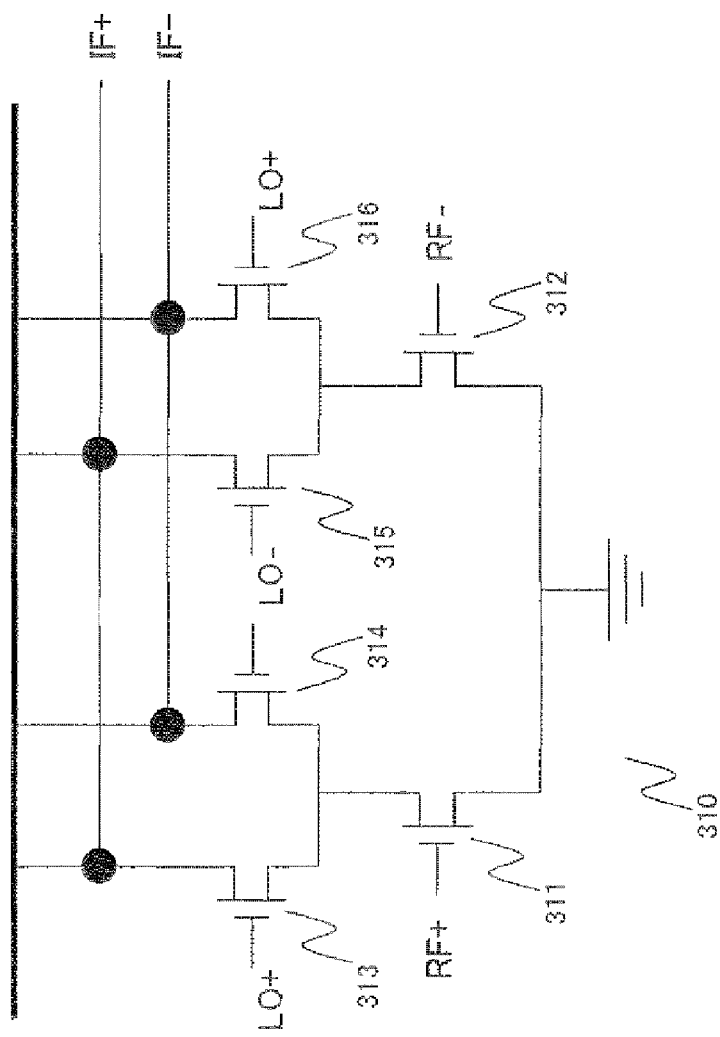
FIG. 7 shows a configuration example of a mixer according to Embodiment 3.

Mixer 310 takes a configuration of a double balance mixer as shown in FIG. 7, for example. In this case, mixer 310 switches input signals RF+, RF− by local signals LO+, LO−, thereby down-converting frequencies of the input signals RF+, RF− to a lower frequency band. Mixer 310 can have a configuration other than that shown in FIG. 7.

(Embodiment 4)

Figure 8:
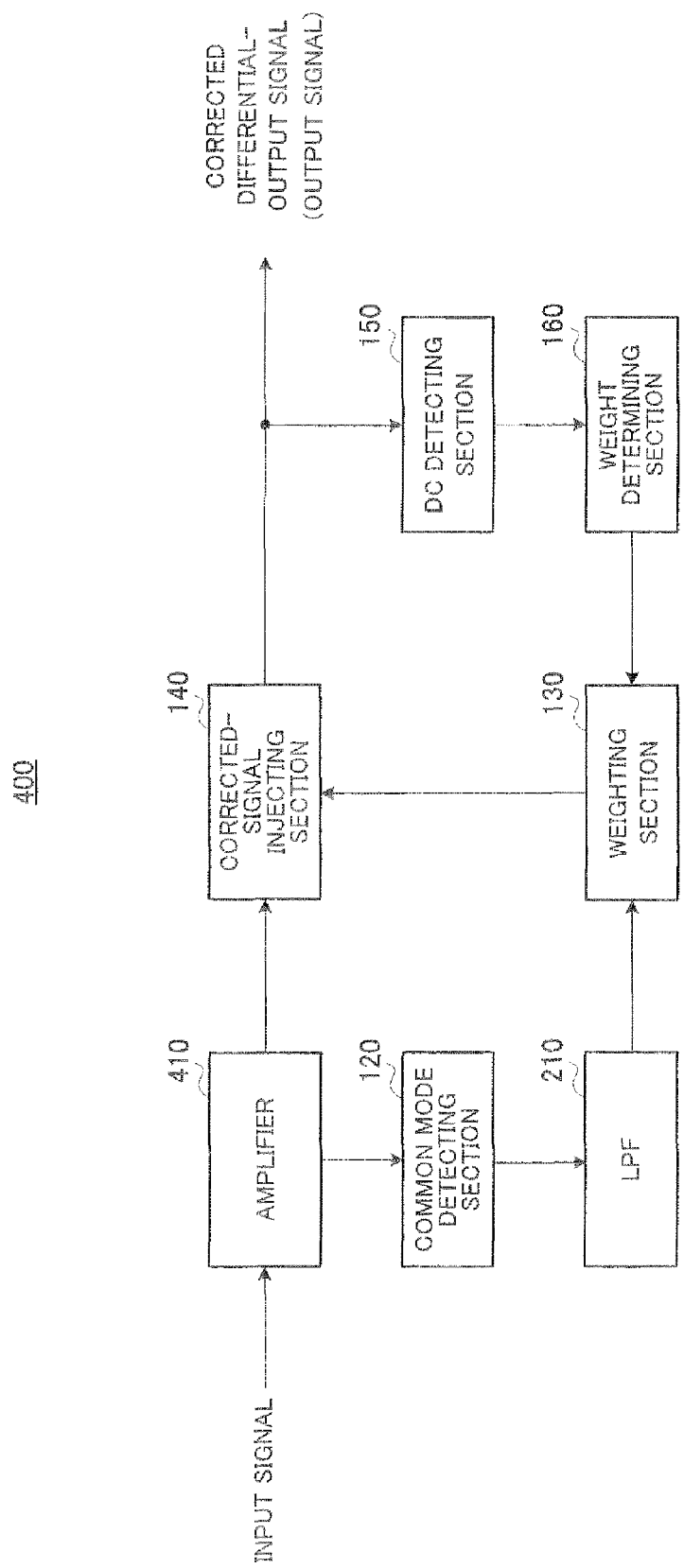
FIG. 8 is a block diagram showing a relevant configuration of a receiver according to Embodiment 4 of the present invention.

FIG. 8 is a block diagram showing a relevant configuration of a receiver according to the present embodiment. In receiver 400 in FIG. 8, constituent portions that are common to those of receiver 200 in FIG. 5 are assigned with the same reference numerals as those in FIGS, and their explanation is omitted. In the present embodiment, amplifier 410 is applied to nonlinear active element section 110, as an example.

Amplifier 410 adjusts (amplifies) an amplitude of an input signal. Amplifier 410 outputs the differential output signal and the common mode output signal that are obtained by adjusting (amplifying) the amplitude of the input signal, to corrected-signal injecting section 140 and common mode detecting section 120 respectively.

Figure 9:
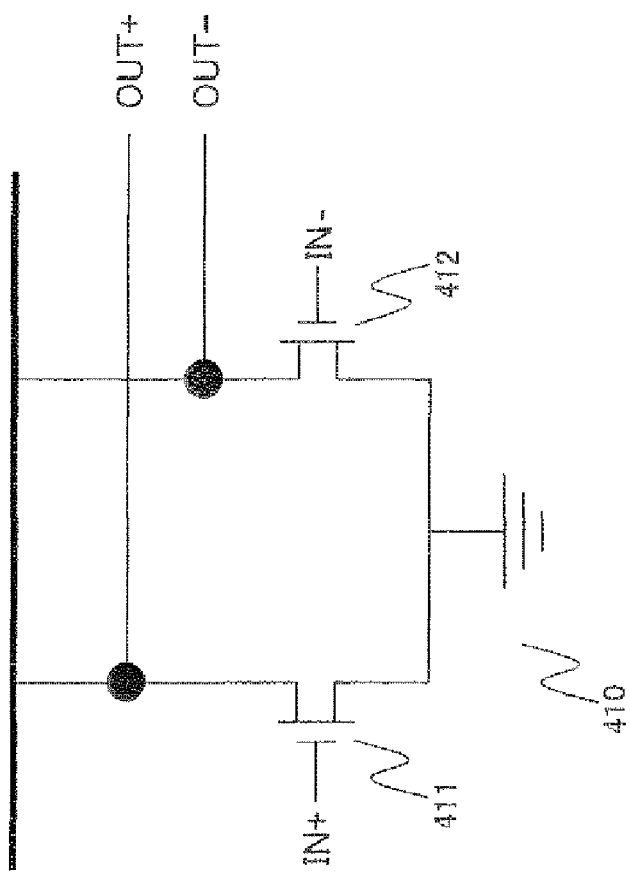
FIG. 9 shows a configuration example of an amplifier according to Embodiment 4.

Amplifier 410 takes a configuration of a differential amplifier as shown in FIG. 9, for example. The amplifier can take a configuration other than that shown in FIG. 9 when a configuration that is known in general is used.

(Embodiment 5)

In the present embodiment, other internal configuration and operation of the DC detecting section are explained. A receiver according to the present embodiment is different from those in Embodiment 1 to Embodiment 4 in that the receiver has DC detecting section 150A in place of DC detecting section 150, and other configurations are similar to those in these embodiments. Therefore, drawings and explanations of the receiver according to the present embodiment are omitted, and only DC detecting section 150A is explained.

Figure 10:
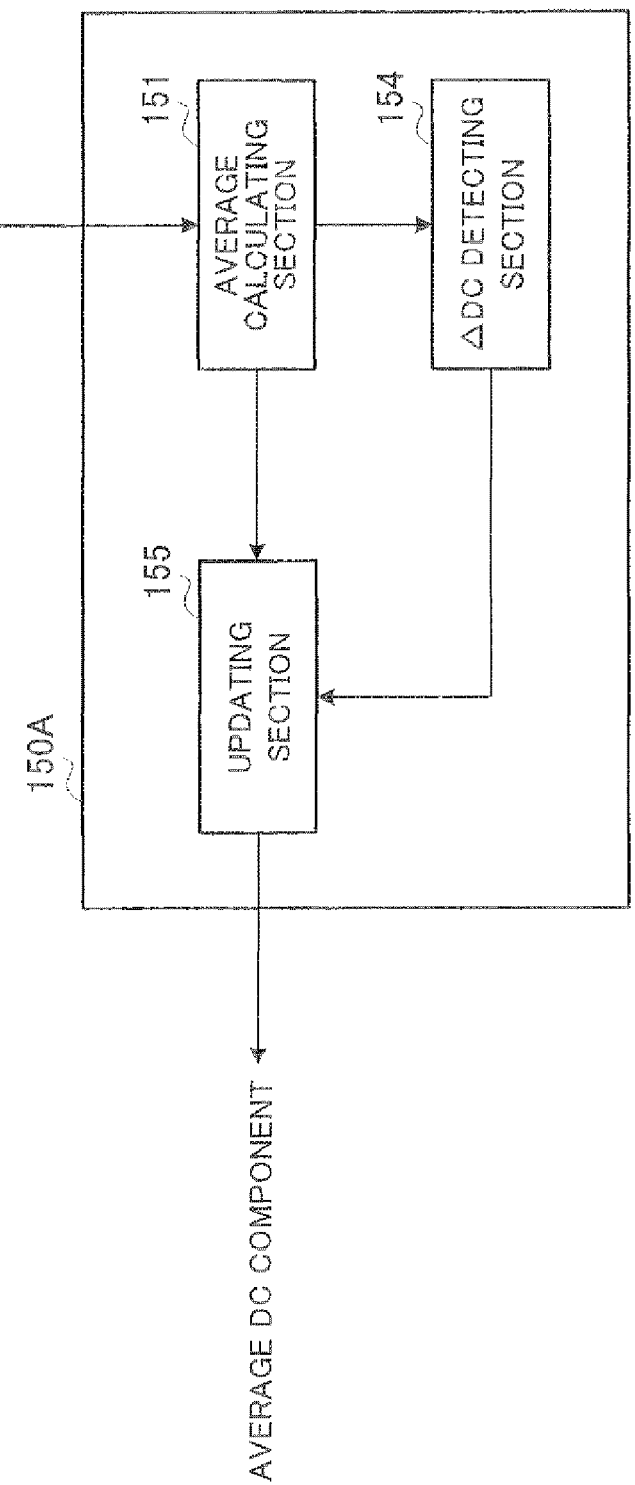
FIG. 10 is a block diagram showing an internal configuration of a DC detecting section according to Embodiment 5 of the present invention.

FIG. 10 is a block diagram showing an internal configuration of DC detecting section 150A according to the present embodiment. In DC detecting section 150A in FIG. 10, constituent portions that are common to those of DC detecting section 150 shown in FIG. 4 are assigned with the same reference numerals, and their explanation is omitted. DC detecting section 150A in FIG. 10 has ADC detecting section 154 and updating section 155, in place of counter section 152 and updating section 153, in DC detecting section 150 in FIG. 4.

In DC detecting section 150, updating section 153 updates the average DC value during each regular period.

On the other hand, in DC detecting section 150A, ADC detecting section 154 calculates a difference between an average DC value (t) that is calculated by average calculating section 151 and an average DC value (t−1) at a time step one before.

ΔDC detecting section 154 determines that an average DC values has converged, when a difference between the average DC value (t−1) and the average DC value (t) becomes smaller than a certain threshold value. At this timing, ΔDC detecting section 154 gives an update instruction of a weighting coefficient to updating section 155.

Updating section 155 updates the average DC value following the update instruction from ΔDC detecting section 154.

These calculations can be considered possible at a speed of about a few dozens of MHz. Therefore, it is general that the above-described time step is about a few dozens of nanoseconds. As described above, because an optimal threshold value is different depending on a system, preferably, an optimal value is determined and used based on an actual evaluation.

As described above, according to the present embodiment, DC detecting section 150A determines a degree of convergence of a value of an average DC component. When it is determined that the value converges, DC detecting section 150A outputs the average DC component to weight determining section 160. With this arrangement, the weighting coefficient can be converged at a higher speed, in addition to obtaining an effect that the second-order inter-modulation distortion can be cancelled with high precision in a simple circuit configuration.

(Embodiment 6)

According to the present embodiment, when a wave state in the periphery of the receiver greatly changes, a value of the update coefficient μ (see equation 13) is temporarily changed to μ_pred. In this case, μ_pred is set in advance, and is set to a large value to shorten the time required for the weighting coefficient to completely converge.

Figure 11:
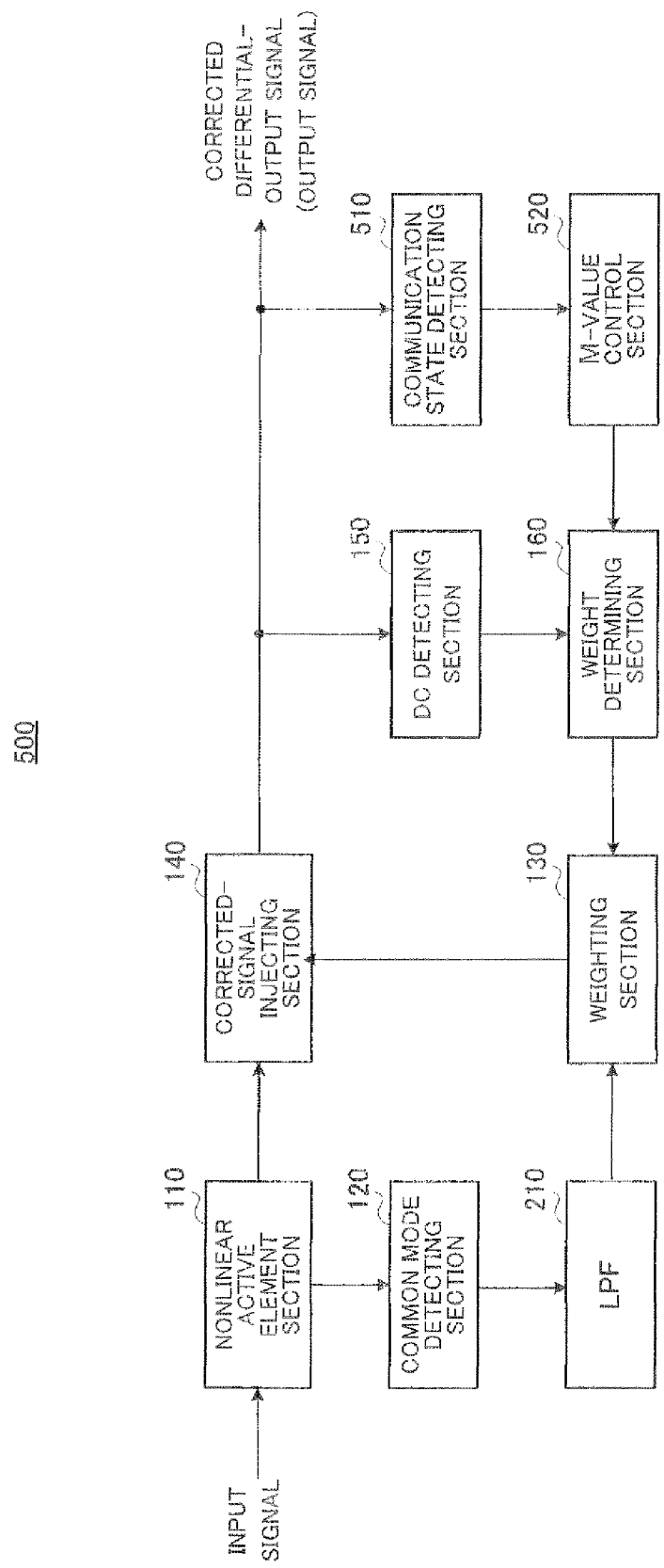
FIG. 11 is a block diagram showing a relevant configuration of a receiver according to Embodiment 6 of the present invention.

FIG. 11 is a block diagram showing a relevant configuration of a receiver according to the present embodiment. In receiver 500 shown in FIG. 11, constituent portions that are common to those of receiver 200 shown in FIG. 5 are assigned with the same reference numerals, and their explanation is omitted. Receiver 500 in FIG. 11 is configured to have communication state detecting section 510 and μ-value control section 520 added to receiver 200 in FIG. 5.

Communication state detecting section 510 checks a variation of a wave state in the periphery of receiver 500. As a method for checking a variation of a wave state, a determination based on various indexes such as a variation difference of an EVM (Error Vector Magnitude) index and a variation difference of a DC value that is detected by DC detecting section 150 is considered. As an example, a case where communication state detecting section 510 checks a variation of a wave state by using a variation difference of the EVM index is explained.

Communication state detecting section 510 calculates an EVM value of the corrected differential-output signal. Next, communication state detecting section 510 calculates a variation difference between an EVM value (t) and an EVM value (t−1) at a time step one before. When the variation difference is larger than a predetermined threshold value, communication state detecting section 510 notifies a μ-value change to μ-value control section 520.

When μ-value control section 520 receives the μ-value change notification from communication state detecting section 510, μ-value control section 520 changes a μ-value to a predetermined μ-pred, and outputs the changed μ-value to weight determining section 160. After a constant time passes, μ-value control section 520 sets the changed μ-value to an original value again, and outputs the μ-value that is set again to weight determining section 160.

As described above, according to the present embodiment, communication state detecting section 510 checks a variation of a wave state at the periphery of receiver 500. When μ-value control section 520 receives the μ-value change notification, μ-value control section 520 changes the μ-value to the predetermined μ-pred, and outputs the changed μ-value to weight determining section 160. Therefore, when the change of the communication state is large, weight determining section 160 determines the weighting coefficient by using the update coefficient μ that is changed to a predetermined value.

As described above, when there is a wave variation of the receiver, the time required for the weighting coefficient to converge can be hastened by temporarily changing the update coefficient μ to a large value. After a regular period has passed, that is, when convergence reaches a final stage, optimal weighting can be determined at a high speed in total, by setting the μ-value to an original small value again. As described above, according to the present embodiment, even when there is a wave variation in the receiver, the time required for the weighting coefficient to converge can be hastened, in addition to obtaining an effect that the second-order inter-modulation distortion can be cancelled with high precision in a simple circuit configuration.

The disclosure of Japanese Patent Application No. 2009-091057, filed on Apr. 3, 2009, including the specification, drawings and abstract, is incorporated herein by reference in its entirety.

Industrial Applicability

According to the second-order distortion correcting receiver and the second-order distortion correcting method of the present invention, second-order inter-modulation distortion can be cancelled with high precision in a simple circuit configuration.

Reference Signs List 100, 200, 300, 400, 500 Receiver
110 Nonlinear active element section
120 Common mode detecting section
130 Weighting section
140 Corrected-signal injecting section
150, 150A DC detecting section
160 Weight determining section
151 Average calculating section
152 Counter section
153, 155 Updating section
154 ADC detecting section
210 LPF
310 Mixer
410 Amplifier
510 Communication state detecting section
520 μ-value control section
311 to 316, 411, 412 Transistor

The invention claimed is:

1. A second-order distortion correcting receiver comprising:
an active element having a nonlinear characteristic that performs a nonlinear process of an input signal and outputs a differential output signal and a common mode output signal;
a common mode detecting section that extracts the common mode output signal;
a weighting section that generates a corrected signal, by assigning weight to the common mode output signal that is extracted;
a corrected-signal injecting section that injects the corrected signal into the differential output signal, and outputs a corrected differential-output signal;
a direct current component detecting section that calculates an average direct current component of the corrected differential-output signal; and
a weight determining section that determines a weighting coefficient to be used in the weighting section, by using the average direct current component.

2. The second-order distortion correcting receiver according to claim 1, wherein the weight determining section determines a coefficient that makes an average direct current component contained in the corrected differential-output signal zero, as the weighting coefficient.

3. The second-order distortion correcting receiver according to claim 1, wherein the weight determining section updates the weighting coefficient, by using both a value of the average direct current component and the weighting coefficient that is used at the current time.

4. The second-order distortion correcting receiver according to claim 1, wherein the weight determining section generates an updated weighting coefficient, by adding a value obtained by multiplying a predetermined update coefficient to the average direct current component, and the weighting coefficient that is used at the current time.

5. The second-order distortion correcting receiver according to claim 4, wherein when a change of a communication state is large, the weight determining section determines the weighting coefficient by changing the update coefficient to a coefficient that is set in advance.

6. The second-order distortion correcting receiver according to claim 1, wherein the direct current component detecting section outputs a value of the average direct current component to the weight determining section during each regular period.

7. The second-order distortion correcting receiver according to claim 1, wherein the direct current component detecting section determines a degree of convergence of a value of the average direct current component, and outputs the average direct current component to the weight determining section when it is determined that the value has converged.

8. The second-order distortion correcting receiver according to claim 1, further comprising a low-pass filter section that is provided between the common mode detecting section and the weighting section, and that removes a frequency component other than a frequency band of the common mode output signal.

9. The second-order distortion correcting receiver according to claim 1, wherein the active element is a mixer that down-converts a frequency of the input signal.

10. The second-order distortion correcting receiver according to claim 1, wherein the active element is an amplifier that adjusts an amplitude of the input signal.

11. A second-order distortion correcting method for removing second-order distortion components that are generated by an active element having a nonlinear characteristic, the method comprising:

extracting a differential output signal and a common mode output signal that are obtained by a nonlinear process performed by the active element to an input signal;

generating a corrected signal, by assigning weight to the common mode output signal;

outputting a corrected differential-output signal, by injecting the corrected signal to the differential output signal;

calculating an average direct current component of the corrected differential-output signal; and determining a weighting coefficient to be used for the weighting, by using the average direct current component.

* * * * *